United States Patent
Kawahara et al.

(10) Patent No.: US 8,093,622 B2
(45) Date of Patent: Jan. 10, 2012

(54) SEMICONDUCTOR DEVICE AND ITS DRIVING METHOD

(75) Inventors: Hideaki Kawahara, Tokyo (JP); Toshimi Satoh, Tokyo (JP); Toshiyuki Tani, Oita (JP)

(73) Assignee: Texas Instruments Incorporated, Dallas, TX (US)

( * ) Notice: Subject to any disclaimer, the term of this patent is extended or adjusted under 35 U.S.C. 154(b) by 506 days.

(21) Appl. No.: 12/184,436

(22) Filed: Aug. 1, 2008

(65) Prior Publication Data

US 2009/0032839 A1    Feb. 5, 2009

(30) Foreign Application Priority Data

Aug. 2, 2007   (JP) ................................ 2007-202209

(51) Int. Cl.
*H01L 29/47* (2006.01)

(52) U.S. Cl. ........ 257/152; 257/107; 257/141; 257/153; 257/E29.036; 257/E29.213; 257/E29.214; 438/133; 438/135

(58) Field of Classification Search ................. 257/107, 257/141, 151–154, E29.036–E29.038, E29.211, 257/E29.212–E29.214; 438/133, 135
See application file for complete search history.

(56) References Cited

U.S. PATENT DOCUMENTS

| | | | | |
|---|---|---|---|---|
| 4,742,380 A | * | 5/1988 | Chang et al. | 257/125 |
| 2008/0105895 A1 | | 5/2008 | Kawahara | |

* cited by examiner

*Primary Examiner* — Matthew E Warren

(74) *Attorney, Agent, or Firm* — Warren L. Franz; Wade J. Brady, III; Frederick J. Telecky, Jr.

(57) ABSTRACT

A semiconductor device having a thyristor SCR with reduced turn-off time. A third semiconductor region of the second conductivity type (anode AN) and a fourth semiconductor region of the first conductivity type (anode gate AG) are formed in the top layer of a first semiconductor region; fifth semiconductor region of the first conductivity type (cathode CA) and sixth semiconductor region of the second conductivity type (cathode gate CG) are formed in the top layer of a second semiconductor region; a gate insulating film and gate electrode MG are formed on the second semiconductor region. When the thyristor is turned off from the on state, a higher potential than that on the anode is applied to the anode gate, and a diode made up of the anode and the anode gate inside the thyristor is made to conduct so as to control the potential of the anode during driving.

9 Claims, 5 Drawing Sheets

SEMICONDUCTOR DEVICE AND ITS DRIVING METHOD

FIELD OF THE INVENTION

The present invention pertains to a semiconductor device and its driving method. More specifically, the present invention pertains to a semiconductor device that includes a thyristor, and its driving method.

BACKGROUND OF THE INVENTION

A thyristor is a type of semiconductor element that has a pnpn structure and that performs a switching operation. Specifically, it is an important high-power control element. For example, FIG. 6 is a cross-sectional view illustrating a semiconductor thyristor of the prior art. Here, in p-type semiconductor substrate 100, first n-type semiconductor region 101 (N1) is formed. In the top layer of said first n-type semiconductor region 101, element separating insulating film 102 is formed.

In prescribed regions in said first n-type semiconductor region 101, at a prescribed depth, second n-type semiconductor region 103 (N2) and first p-type semiconductor region 104 (P1) are formed. In addition, in the top layer of second n-type semiconductor region 103, second p-type semiconductor region 105 is formed as anode AN. Also, in the top layer of first p-type semiconductor region 104, in the regions separated by element separating insulating film 102, third p-type semiconductor region 107 as gate G and third n-type semiconductor region 108 as cathode CA are formed.

Also, first interlayer insulating film 110 made of silicon oxide or the like is formed over the entire surface to cover second p-type semiconductor region 105, third p-type semiconductor region 107 and third n-type semiconductor region 108. Contact holes CT1 are formed to reach second p-type semiconductor region 105, third p-type semiconductor region 107 and third n-type semiconductor region 108. First electroconductive layer 111 is buried therein, and second electroconductive layer 112 is formed on first interlayer insulating film 110 and connected to said first electroconductive layer.

Also, second interlayer insulating film 113 made of silicon oxide is formed to cover them. Contact holes CT2 are opened to reach second electroconductive layer 112, etc.; third electroconductive layer 114 is formed and buried, and fourth electroconductive layer 115 is formed on second interlayer insulating film 113 and connected to it.

As explained above, said thyristor has three terminals, that is, anode AN made of the p-type semiconductor and cathode CA made of the n-type semiconductor at the two ends of the pnpn structure, and gate G made of the p-type semiconductor sandwiched between them. For example, by sinking current to gate G, holes are injected from anode AN and electrons are injected from cathode CA, so that the thyristor is turned on. When the thyristor with said structure is turned off from the on state, a certain amount of time is required to evacuate the holes that were injected into first n-type semiconductor region 101, so that the turn-off time is increased, which is undesirable.

The purpose of the present invention is to solve the aforementioned problems of the prior art by providing a semiconductor device having a thyristor with a reduced turn-off time, and its driving method.

SUMMARY OF THE INVENTION

The present invention provides a method for driving a semiconductor device having a thyristor with a cathode, cathode gate, anode, and anode gate, wherein driving is performed such that the potential of said anode is controlled by the following operation: when said thyristor is turned off from the on state, a potential higher than that of said anode is applied to said anode gate, so that the diode between said anode and said anode gate of said thyristor conducts.

Also, the present invention provides a semiconductor device characterized in that it comprises the following parts: a first semiconductor layer of a first conductivity type; a second semiconductor layer of the first conductivity type formed on the top surface of said first semiconductor layer; a third semiconductor layer of a second conductivity type, which is formed on the top surface of said first semiconductor layer and separated from said second semiconductor layer; a fourth semiconductor layer of the second conductivity type formed on the top surface of said second semiconductor layer; a fifth semiconductor layer, which is formed on the top surface of said second semiconductor layer and separated from said fourth semiconductor layer; a sixth semiconductor layer of the first conductivity type formed on the top surface of said third semiconductor layer; a seventh semiconductor layer of the second conductivity type, which is formed on the top surface of said third semiconductor layer and separated from said sixth semiconductor layer; a gate insulating film formed on the top surface of said third semiconductor layer from the interface between said first semiconductor layer and said third semiconductor layer to the interface between said third semiconductor layer and said sixth semiconductor layer; and a gate electrode formed on said gate insulating film; wherein said first, second, third, fourth and sixth semiconductor layers form a thyristor structure, such that when said thyristor is turned off from the on state, the voltage applied to said fifth semiconductor layer is controlled to be higher than the voltage on said fourth semiconductor layer, and the diode structure between said fourth semiconductor layer and said fifth semiconductor layer is in the reverse-biased state.

REFERENCE NUMERALS AND SYMBOLS AS SHOWN IN THE DRAWINGS

In the figures, 10 represents a p-type semiconductor substrate, 11 represents a bottom insulating film, 12 represents a trench-shaped element separating insulating film, 13 represents a LOCOS element separation insulating film, 20 and N1 represent a first n-type semiconductor region, 21 and N2 represent a second n-type semiconductor region, 22 and P1 represent a first p-type semiconductor device, 23 represents a second p-type semiconductor region, 24 represents a third n-type semiconductor region, 25 represents a third p-type semiconductor region, 26 represents a fourth (third) n-type semiconductor region, 30 represents a gate insulating film, 31 represents a gate electrode, 32 represents a first interlayer insulating film, 33 represents a first electroconductive layer, 34 represents a second electroconductive layer, 35 represents a second interlayer insulating film, 36 represents a third electroconductive layer, 37, represents a fourth electroconductive layer, CT1 and CT2 represent contact holes, AN represents an anode, AG represents an anode gate, AGC represents an anode gate control part, CA represents a cathode, CG represents a cathode gate, CGC represents a cathode gate control part, MG represents a gate electrode, MGC represents an MOS gate control part, and D represents a diode.

DESCRIPTION OF THE EMBODIMENTS

According to the semiconductor device and its driving method of the present invention, by actively controlling the anode gate, it is possible to reduce the turn-off time of the thyristor. Embodiments of the semiconductor device and its driving method of the present invention will be explained below with reference to figures.

Embodiment 1

Figure 1:
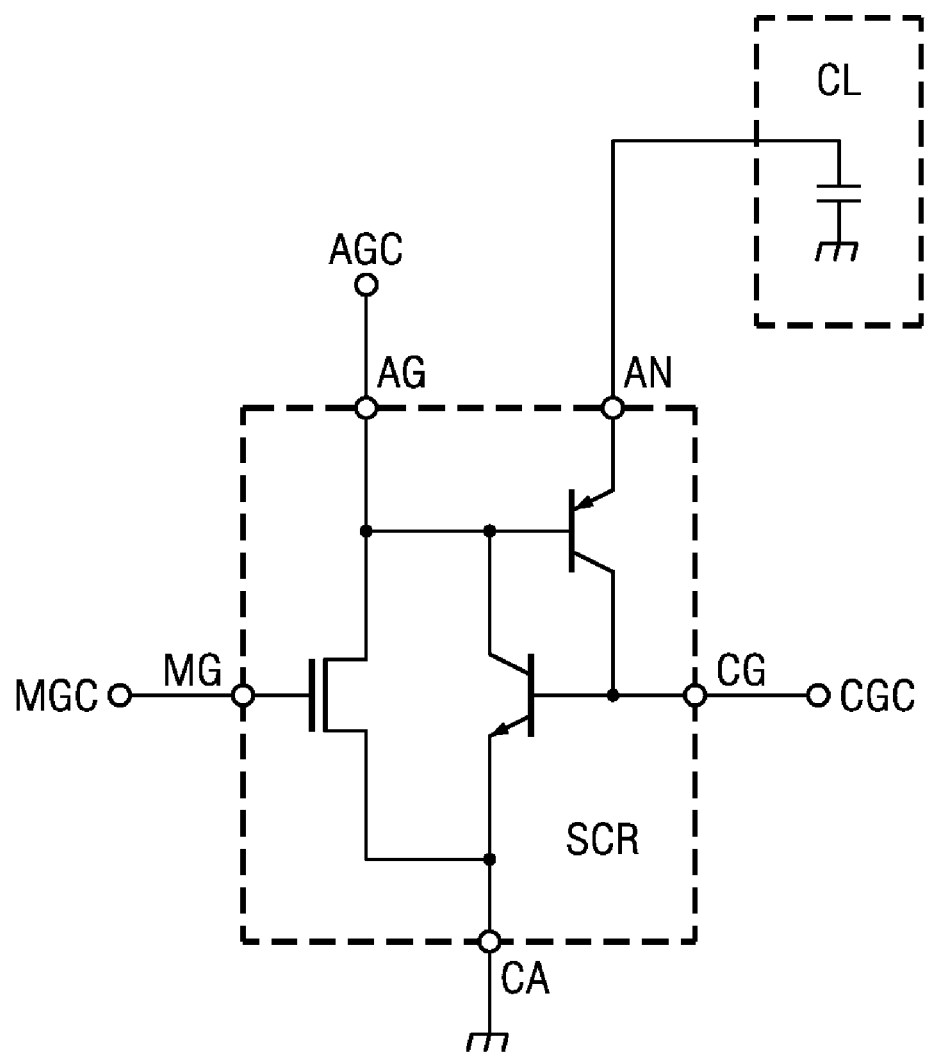
FIG. 1 is an equivalent circuit diagram of a thyristor in the semiconductor device pertaining to Embodiment 1 of the present invention.

FIG. 1 is an equivalent circuit diagram illustrating the thyristor in the semiconductor device of this embodiment. The thyristor SCR (Semiconductor-Controlled Rectifier) may have a constitution, e.g., that includes two bipolar transistors. In the present embodiment, it also has a MOS transistor with the constitution shown in the figure. Here, anode gate control AGC, cathode gate control CGC, and MOS gate control MGC are connected to anode gate AG, cathode gate CG, and MOS type gate electrode MG, respectively, and a prescribed signal is input. Cathode CA is grounded, and a load element, such as a capacitive load element CL, is connected to anode AN.

Figure 2:
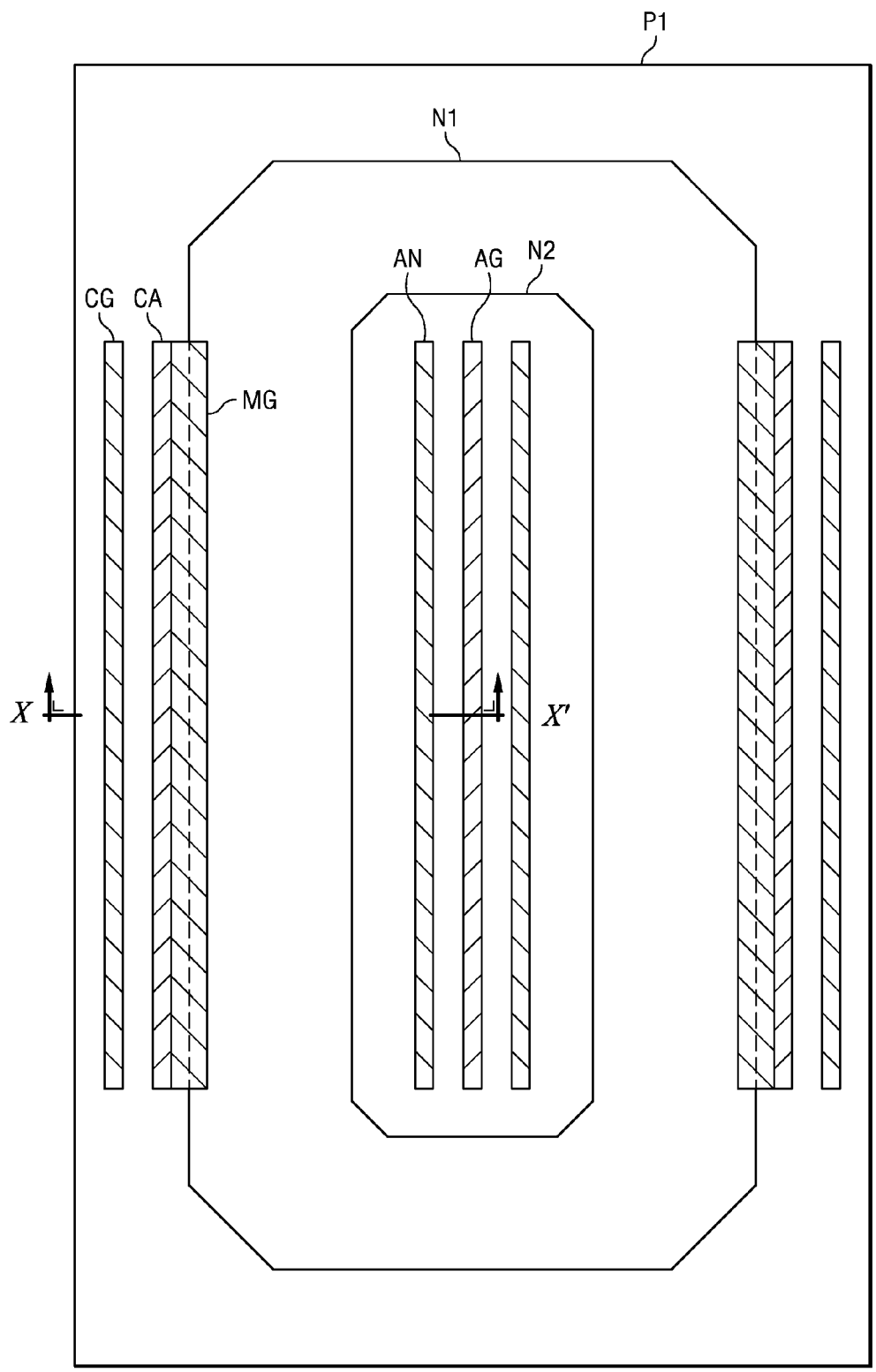
FIG. 2 is a plan view illustrating the semiconductor device having a thyristor in Embodiment 1 of the present invention.
Figure 3:
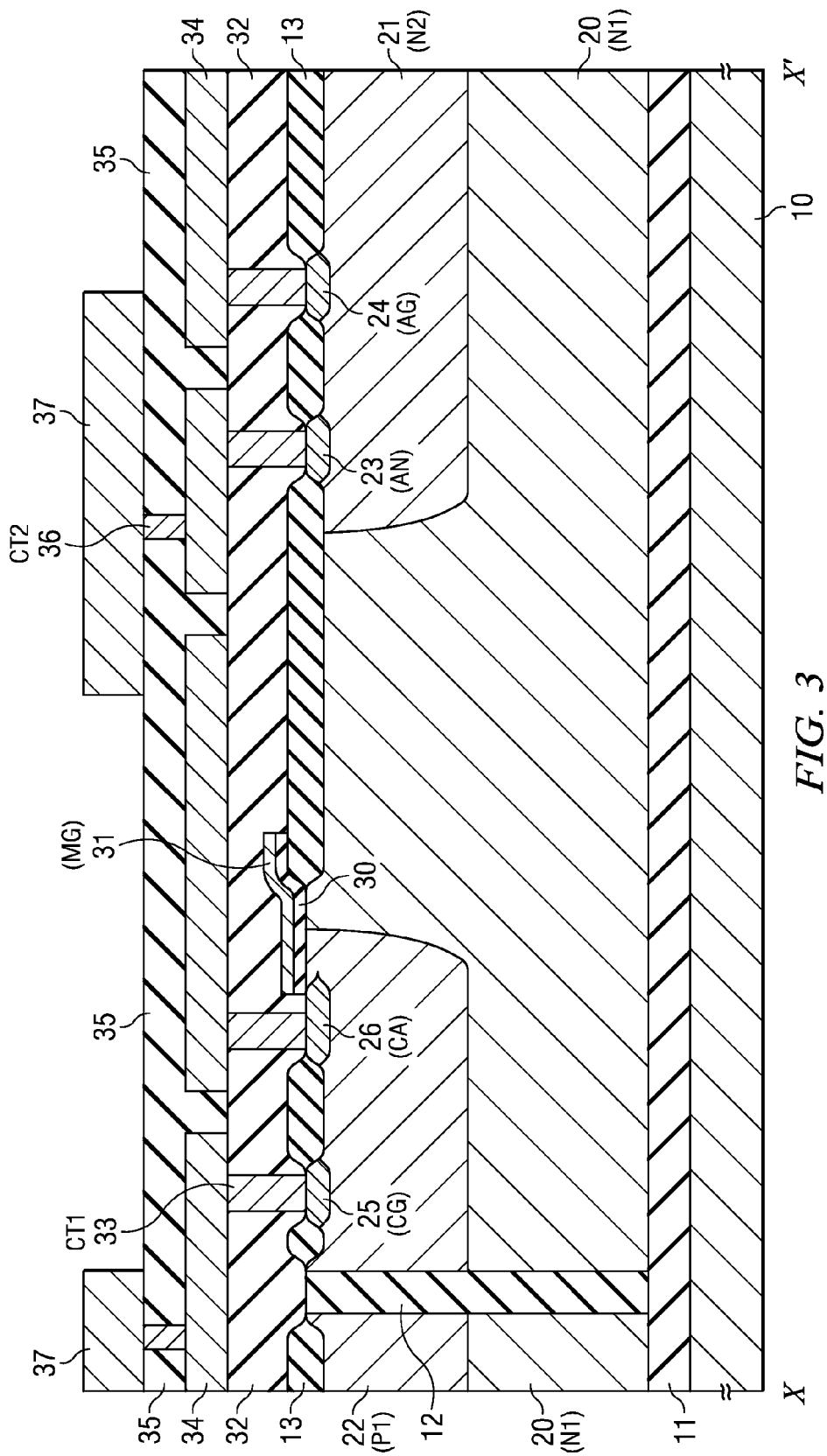
FIG. 3 is a cross-sectional view taken across X-X' in FIG. 2.

FIG. 2 is a plan view of the semiconductor device for embodying the method for driving a semiconductor device having a thyristor pertaining to the present embodiment, and FIG. 3 is a cross sectional view taken across X-X' in FIG. 2. The plan view of FIG. 2 shows that the regions for the anode, cathode, etc., are arranged in a left/right symmetrical configuration; the constitution of one side (the left side) is shown in the cross-sectional view of FIG. 3.

Bottom insulating film 11 of silicon oxide is formed on, for example, p-type semiconductor substrate 10. First n-type semiconductor region (n-type semiconductor layer) 20 (N1) made of silicon is formed thereon, forming a so-called SOI (semiconductor-on-insulator) substrate. For example, through first n-type semiconductor region 20, trench-type element-separating insulating film 12 and element separating insulating film 13 formed using the LOCOS (local oxidation of silicon) method in the top layer of first n-type semiconductor region 20 are formed to impart element separation. Said element separating insulating films 12, 13 are made of silicon oxide. Said first n-type semiconductor region 20 is completely separated from the other semiconductor region by means of element-separating insulating film 12 that reaches bottom insulating film 11, and an independent structure is formed.

Also, for example, second n-type semiconductor region (type well region) 21 (N2) with an impurity concentration different from that of first n-type semiconductor region 20 is formed at a prescribed depth in the top layer in the prescribed region of first n-type semiconductor region 20, and, in a region different from that of second n-type semiconductor region 21, first p-type semiconductor region (p-type well region) 22 (P1) is formed. Here, the impurity concentration of second n-type semiconductor region 21 is higher than that of first n-type semiconductor region 20.

Also, for example, in the region separated by element separating insulating film 13 in the top layer of second n-type semiconductor region 21, second p-type semiconductor region (first p-type contact region) 23 as anode AN and third n-type semiconductor region (first n-type contact region) 24 as anode gate AG are formed. Here, the impurity concentration of third n-type semiconductor region 24 is different from that of second n-type semiconductor region 21.

Also, for example, in the region separated by element separating insulating film 13 in the top layer of first p-type semiconductor region 22, third p-type semiconductor region second p-type contact region) 25 as cathode gate CG and fourth n-type semiconductor region (second n-type contact region) 26 as cathode CA are formed. Here, the impurity concentration of third p-type semiconductor region 25 is higher than that of first p-type semiconductor region 22.

As explained above, second p-type semiconductor region 23, first n-type semiconductor region 20, second n-type semiconductor region 21, first p-type semiconductor region 22, and fourth n-type semiconductor region 26 form a thyristor. Also, the constitution is such that third n-type semiconductor region 24 and third p-type semiconductor region 25 are connected to first n-type semiconductor region 20 and first p-type semiconductor region 22, respectively.

Gate insulating film 30 and gate electrode 31 (MG) are formed on the upper layer of first p-type semiconductor region 22, at least in the region from the interface between first n-type semiconductor region 20 and first p-type semiconductor region 22 to the interface between first p-type semiconductor region 22 and fourth n-type semiconductor region 26, forming a MOS transistor.

First interlayer insulating film 32 of silicon oxide is formed over the entire surface to cover second p-type semiconductor region 23, third n-type semiconductor region 24, third p-type semiconductor region 25, fourth n-type semiconductor region 26, and gate electrode 31. Contact holes CT1 are formed to reach second p-type semiconductor region 23, third n-type semiconductor region 24, third p-type semiconductor region 25 and fourth n-type semiconductor region 26. First electroconductive layer 33 is formed and buried, and second electroconductive layer 34 is formed on first interlayer insulating film 32.

In addition, second interlayer insulating film 35 of silicon oxide is formed to cover said layers. Contact holes CT2 are formed to reach second electroconductive layer 34. Third electroconductive layer 36 is formed and buried, and fourth electroconductive layer 37 is formed on second interlayer insulating film 35 and connected to it. As explained above, electroconductive layers for input/output are formed and connected to third n-type semiconductor region 24 (anode gate AG), third p-type semiconductor region 25 (cathode gate CG), and fourth n-type semiconductor region 26 (cathode CA). Cathode CA is grounded.

The second p-type semiconductor region 23 is the anode AN region. For example, it is connected via fourth electroconductive layer 37 to a capacitive load element as the load element in a region not shown in the figure.

Figure 4:
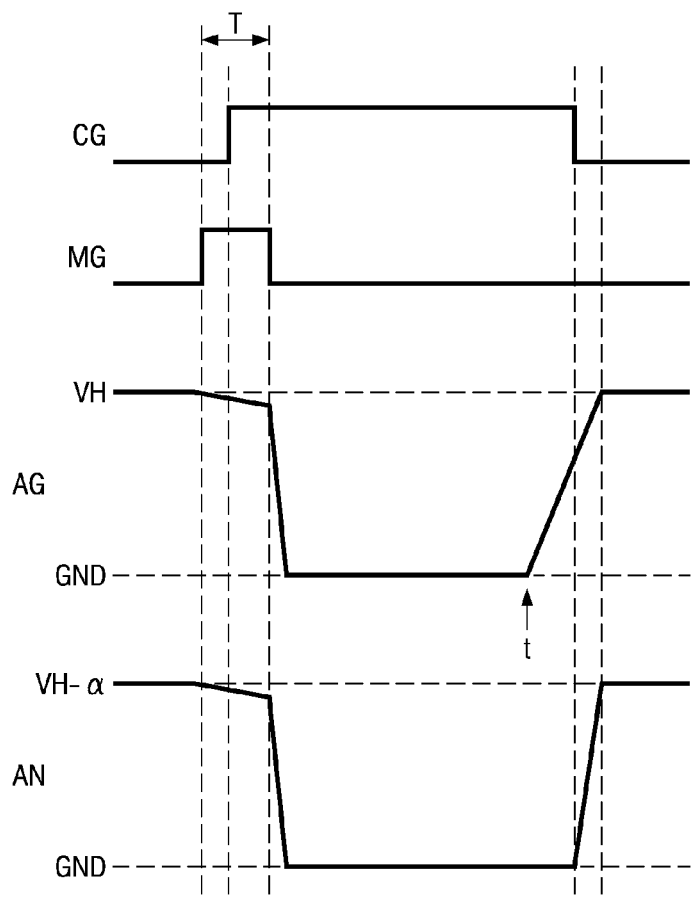
FIG. 4 is a timing chart illustrating the method for driving a thyristor in the semiconductor device in Embodiment 1 of the present invention.

FIG. 4 is a timing chart illustrating the driving method of the thyristor in the semiconductor device of the present embodiment.

In the semiconductor device in this embodiment, by means of on/off control of cathode gate CG of the thyristor, the potential of anode AN is controlled by the output of the thyristor, that is, the constitution is for charging and discharging capacitive load element CL. When thyristor SCR is turned on, capacitive load element CL discharges, i.e., the charge on capacitive load element CL flows to cathode CA. For example, when the thyristor is turned on from the off state, anode gate AG is opened, and cathode gate CG is turned on from the off state; that is, it is set to a higher potential than the cathode. Here, as shown in FIG. 4, driving is performed such that the on potential is applied to gate electrode MG during period T, which includes the timing when cathode gate CG is turned on from the off state.

When the thyristor is on, the MOS transistor is first turned on with a limited current, the MOS transistor of first n-type semiconductor region 20/gate electrode MG/cathode CA is turned on, and, due to the operation of the MOS transistor within the thyristor, the potential of anode gate AG is pulled down below the potential of anode AN. As a result, the pn junction of anode AN and anode gate AG is forward-biased, cathode gate CG is turned on, and current flows so that the thyristor is turned on, and a steep rise in the leading edge of the current waveform can be suppressed. This is effective as a countermeasure to EMI (Electromagnetic Interference: undesired radiation noise). The charging of capacitive load element CL occurs when thyristor SCR is turned off.

The thyristor of the present embodiment has an anode gate AG. When the thyristor is turned off from the on state, a potential higher than that of anode AN is applied to anode gate AG, and the diode comprising the anode and anode gate conducts, so that the potential of anode AN is controlled during driving. Also, in this case, when the thyristor is turned off from the on state, driving is performed so that the potential of the anode gate is greater than or equal to that of the anode at a timing that precedes the turning off of the cathode gate from the on state. By bringing anode gate AG to a higher potential than anode AN, the diode in the thyristor comprising anode gate AG and anode AN becomes short-circuited or reverse-biased, and thyristor SCR is turned off. In this process, gate electrode MG is turned off, and cathode gate CG is at the same potential as cathode CA, so that thyristor SCR is not turned on.

The addition of anode gate AG makes it possible to efficiently evacuate the holes in first n-type semiconductor region 20 that were injected when the thyristor was turned on. When it is turned off, first n-type semiconductor region 20 is set to a higher potential than anode AN via anode gate AG, so that the holes in first n-type semiconductor region 20 can easily be evacuated from the anode. Consequently, the turn-off time can be reduced compared with the case in which the holes were swept out only due to the fall of cathode gate CG potential to ground or a negative potential. Also, there is no adverse effect of spreading in the depletion layer that determines the voltage rating even when anode gate AG is added, so that it is possible to reduce the turn-off time while maintaining voltage rating.

When it is turned off, by keeping the MOS transistor on for a prescribed period, it is possible to evacuate holes from first n-type semiconductor region 20 more quickly, which contributes to reducing the turn-off time.

As explained above, the thyristor can be turned off with a short turn-off time. In addition, by applying a higher potential to anode gate AG than anode AN and making the thyristor SCR diode comprising anode AN and anode gate AG conduct, the potential of anode AN can be controlled during driving. Assuming that the voltage rating of the diode comprising said anode AN and anode gate AG is a, it is possible to make the potential of anode AN rise to VH-a with respect to potential VH applied to anode gate AG.

As explained above, by simply connecting anode AN of the thyristor of the semiconductor device of the present embodiment to the load element, it is possible to drive the thyristor with three prescribed signals from anode gate control AGC, cathode gate control CGC, and MOS gate control MGC. For example, compared with the case in which the anode control element is connected to enable direct input to anode AN for charging the capacitive load element, it is possible to reduce the number of control elements used to drive the thyristor, so that it is thereby possible to realize a smaller size and a higher integration level of the device.

The thyristor in the semiconductor device in this embodiment has a constitution in which the thyristor is completely separated for the elements by the bottom insulating film and the trench-shaped element separating insulating film. As a result, by reducing the time needed for evacuating the holes during the off time, the turn-off time of the thyristor can be reduced.

Also, in FIG. 4, when ground potential GND is the off potential, the on potential of cathode gate CG and the on potential of gate electrode MG are about 0.8 V and 5 V, respectively, and potential VH is about 100 V. For example, when the voltage rating of the diode comprising anode AN and anode gate AG is about 10 V, the potential of anode AN when the thyristor is off rises to about 90 V.

Embodiment 2

Figure 5:
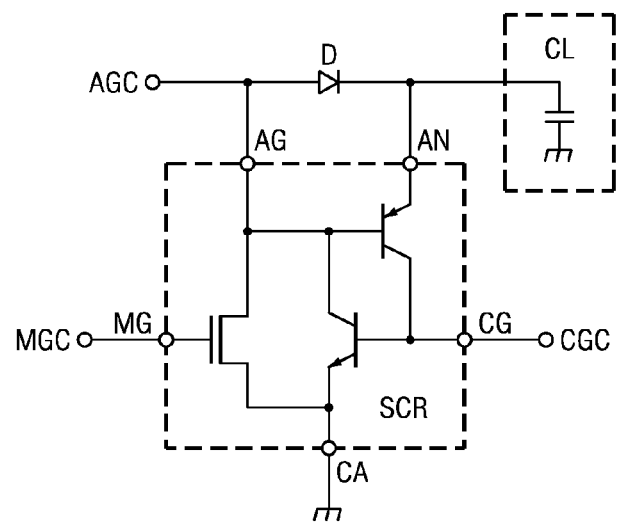
FIG. 5 is an equivalent circuit diagram of the thyristor in the semiconductor device in Embodiment 2 of the present invention.
Figure 6:
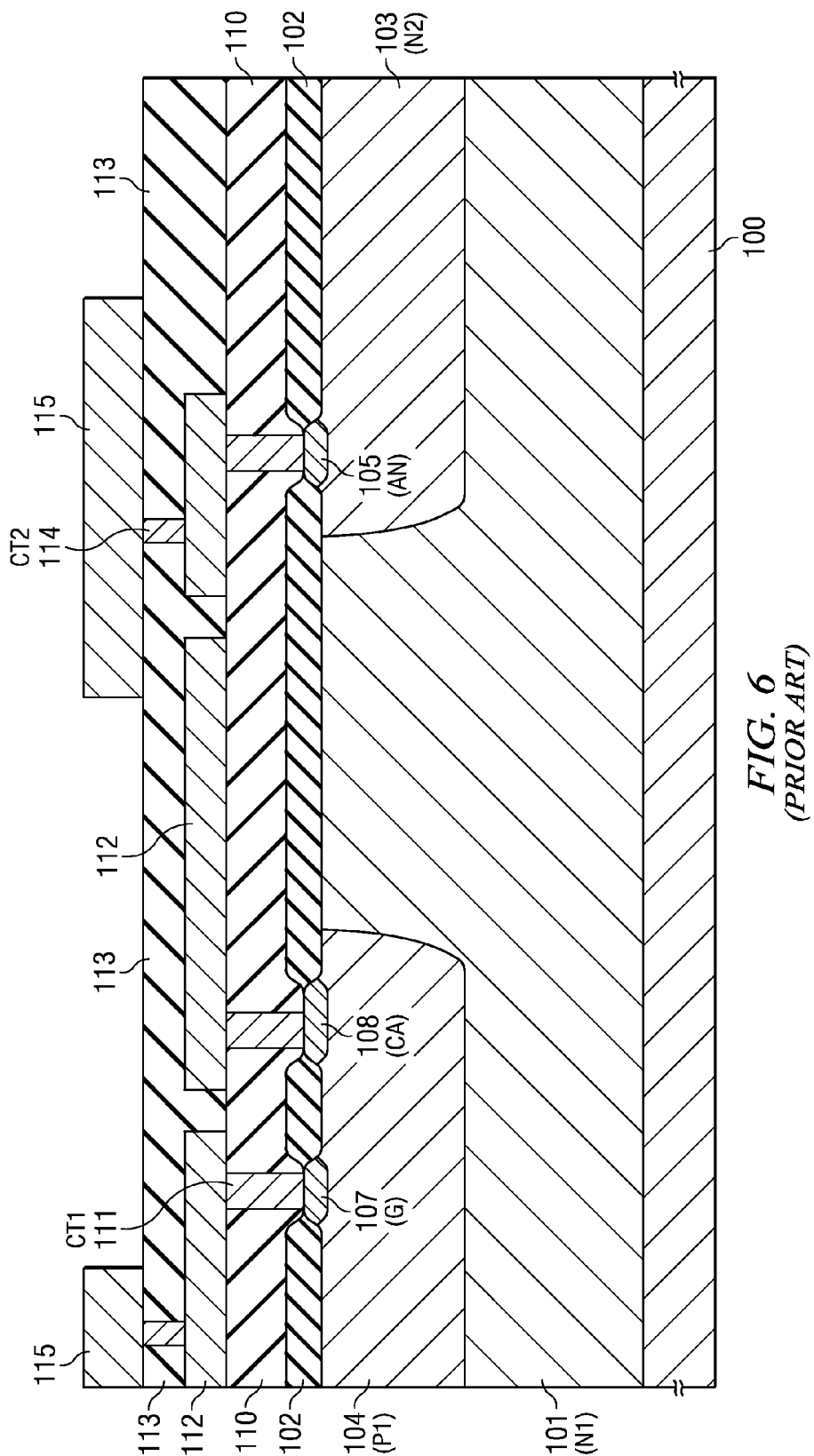
FIG. 6 is a cross-sectional view illustrating the semiconductor device having a thyristor in the prior art.

FIG. 5 is an equivalent circuit diagram illustrating the thyristor in the semiconductor device in this embodiment.

As in Embodiment 1, for example, thyristor SCR has a constitution that includes two bipolar transistors. In this embodiment, it also has a MOS transistor with the constitution shown in the figure. Here, anode gate control AGC, cathode gate control CGC, and MOS gate control MGC are connected to anode gate AG, cathode gate CG and MOS gate electrode MG, respectively, and the prescribed signal is input. Cathode CA is grounded, and a load element, such as capacitive load element CL, is connected to anode AN.

Here, this embodiment differs from Embodiment 1 in that external diode element D is formed between anode gate AG and anode AN. Said external diode element D has a second anode and a second cathode. Here, the second anode is connected to anode gate AG of thyristor SCR, and the second cathode is connected to anode AN of thyristor SCR. Said external diode element can be formed, for example, on the same substrate as the substrate of which said thyristor is formed. As shown in a cross-sectional view similar to FIG. 3, it is formed and connected to the thyristor by wiring (not shown in the figure). Also, by means of the element separation insulating film that reaches bottom insulating film 11, the region where the diode element is formed is completely separated from the thyristor formation region and is an independent structure.

Charging of said capacitive load element CL can be performed from the anode gate through external diode element D. For example, it is possible to raise the potential of anode AN of the diode with a forward voltage drop of only about 0.8 V. The discharge of capacitive load element CL is performed by turning on thyristor SCR, as in Embodiment 1.

In the method for driving a semiconductor device in this embodiment, as in Embodiment 1, by adding anode gate AG, it is possible to realize the effective evacuation of holes from first n-type semiconductor region 20 that were injected when thyristor was turned on, and it is possible to shorten the turn-off time while maintaining the voltage rating.

In addition, by simply connecting anode AN to the load element, it is possible to drive the thyristor by the three prescribed signals from anode gate control AGC, cathode gate control CGC and MOS gate control MGC. It is possible to reduce the number of the control elements used to drive the thyristor so that it is possible to realize a smaller size and higher integration level of the device than the case in which the anode control element is connected to enable direct input to anode AN for charging the capacitive load element.

The present invention is not limited by the foregoing explanation. For example, in addition to the capacitive load element, the load element connected to the anode may also be a resistive load element or an inductive load element. Also, for example, the plan view and cross-sectional view of the semiconductor device for realizing the thyristor are not limited to those of said embodiment. The embodiment of the semiconductor device may also be realized by adopting those associated with the circuit diagram shown in FIG. 1 and that allows said driving. In addition, various modifications may be adopted as long as the essence of the present invention is observed.

The semiconductor device and its driving method of the present invention can be adopted as a semiconductor device that comprises elements that form a half-bridge rectifier for a power supply controller, etc., and its driving method.

The invention claimed is:

1. A method for driving a semiconductor device, comprising:
   providing a device including:
      an n-type semiconductor layer formed on a substrate;
      an n-type well region of higher n-type impurity concentration than the semiconductor layer formed in a top portion of the semiconductor layer;
      a p-type well region formed in the top portion of the semiconductor layer laterally spaced from the n-type well region;
      a first p-type contact region formed in a top portion of the n-type well region;
      a first n-type contact region of different n-type impurity concentration than the n-type well region formed in the top portion of the n-type well region laterally spaced from the first p-type contact region;
      a second p-type contact region of higher p-type impurity concentration than the p-type well region formed in a top portion of the p-type well region;
      a second n-type contact region formed in the top portion of the p-type well region laterally spaced from the second p-type contact region; and
      a gate defined by a gate insulating film and a gate electrode formed over the p-type well region at least from an interface of the p-type well region with the second n-type contact region to an interface of the p-type well region with the semiconductor layer;
   wherein the first p-type contact region, the n-type well region, the n-type semiconductor layer, the p-type well region and the second n-type contact region form a thyristor with an anode at the first p-type contact region, a cathode at the second n-type contact region, an anode gate at the first n-type contact region, and a cathode gate at the second p-type contact region; and the second n-type contact region, the n-type semiconductor layer 20 and the p-type well region under the gate define source, drain and channel regions of a MOS transistor;
   turning the thyristor from an "off" state to an "on" state by first applying an "on" potential to the gate electrode to turn the MOS transistor "on", thereby lowering a potential at the anode gate to below a potential at the anode and forward biasing a diode comprising the anode and anode gate; and then, with the "on" potential still applied to the gate electrode, setting a potential at the cathode gate to a higher potential than the cathode, thereby flowing current between the anode and cathode; and
   turning the thyristor from an "on" state to an "off" state by first applying a potential to the anode gate to set the potential of the semiconductor layer to a higher potential than the anode to reverse bias the diode; and thereafter reducing the potential set at the cathode gate to the same potential as the cathode.

2. The method of claim 1, wherein the thyristor is connected for discharging a capacitive load element when the thyristor is in the "on" state, and for charging the capacitive load element when the thyristor is in the "off" state.

3. The method of claim 1, wherein providing the device includes providing a bottom insulating film below the semiconductor layer to isolate the thyristor.

4. The method of claim 3, wherein providing the device includes also providing a trench-type insulating film to further isolate the thyristor, the trench-type insulating film extending from the top portion of the semiconductor region to the bottom insulating film.

5. The method of claim 4, wherein providing the device includes also providing an element separating insulating film to further isolate the thyristor, the element separating insulating film being formed using a local oxidation of silicon (LOCOS) method in the top portion of the semiconductor layer.

6. The method of claim 1, wherein the MOS transistor is kept turned "on" for a prescribed period when the thyristor is in the "off" state.

7. The method of claim 1, wherein the application of the "on" potential to the gate electrode is terminated prior to turning the thyristor from the "on" state to the "off" state.

8. The method of claim 1, wherein the MOS transistor is turned "off" when the thyristor is turned to the "off" state.

9. The method of claim 1, wherein the diode has a given a voltage rating, and the potential at the anode is made to rise to a potential VH-α with respect to a potential VH applied to the anode gate.

* * * * *